(12) United States Patent
D'Anna et al.

(10) Patent No.: US 6,838,731 B1
(45) Date of Patent: Jan. 4, 2005

(54) MICROWAVE TRANSISTOR STRUCTURE HAVING STEP DRAIN REGION

(75) Inventors: Pablo D'Anna, Redding, CA (US); Joseph H. Johnson, Phoenix, AZ (US)

(73) Assignee: Sirenza Microdevices, Inc., Broomfield, CO (US)

( * ) Notice: Subject to any disclaimer, the term of this patent is extended or adjusted under 35 U.S.C. 154(b) by 121 days.

(21) Appl. No.: 10/410,908

(22) Filed: Apr. 9, 2003

(51) Int. Cl.[7] .............................................. H01L 29/76
(52) U.S. Cl. ...................... 257/343; 257/408; 257/409; 257/288
(58) Field of Search .......................... 257/343, 408–409, 257/288

(56) References Cited

U.S. PATENT DOCUMENTS 5,869,875 A * 2/1999 Hebert ........................ 257/382

* cited by examiner

Primary Examiner—Luan Thai
(74) Attorney, Agent, or Firm—Boris G. Tankhilevich

(57) ABSTRACT

A microwave transistor structure having a step drain region comprising: (A) a substrate having a top surface; (B) a silicon semiconductor material of a first conductivity type, having a first dopant concentration and a top surface; (C) a conductive gate overlying and insulated from the top surface of the silicon semiconductor material; (D) at least one horizontal drain extension region of a second conductivity type and having a horizontal drain extension dopant concentration; (E) a step drain region formed in the silicon semiconductor material, and contacting the horizontal drain extension region; (F) a body region of the first conductivity type and having a body region dopant concentration; (G) a source region of the second conductivity type and having a source region dopant concentration; (H) a shield plate region formed on the top surface of the silicon semiconductor material over a portion of the horizontal drain extension region, the shield plate being adjacent and parallel to the horizontal drain extension region; the shield plate being adjacent and parallel to the conductive gate region; and (I) a conductive plug region.

64 Claims, 4 Drawing Sheets

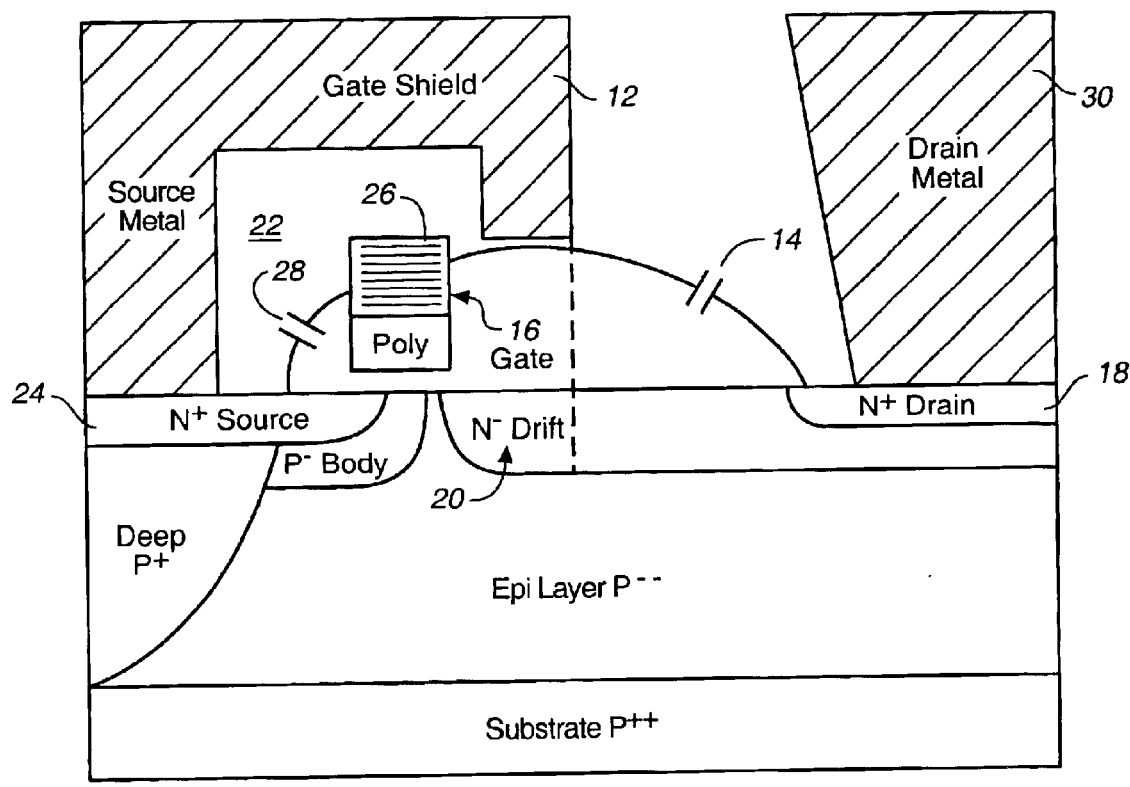
FIG._1
(PRIOR ART)

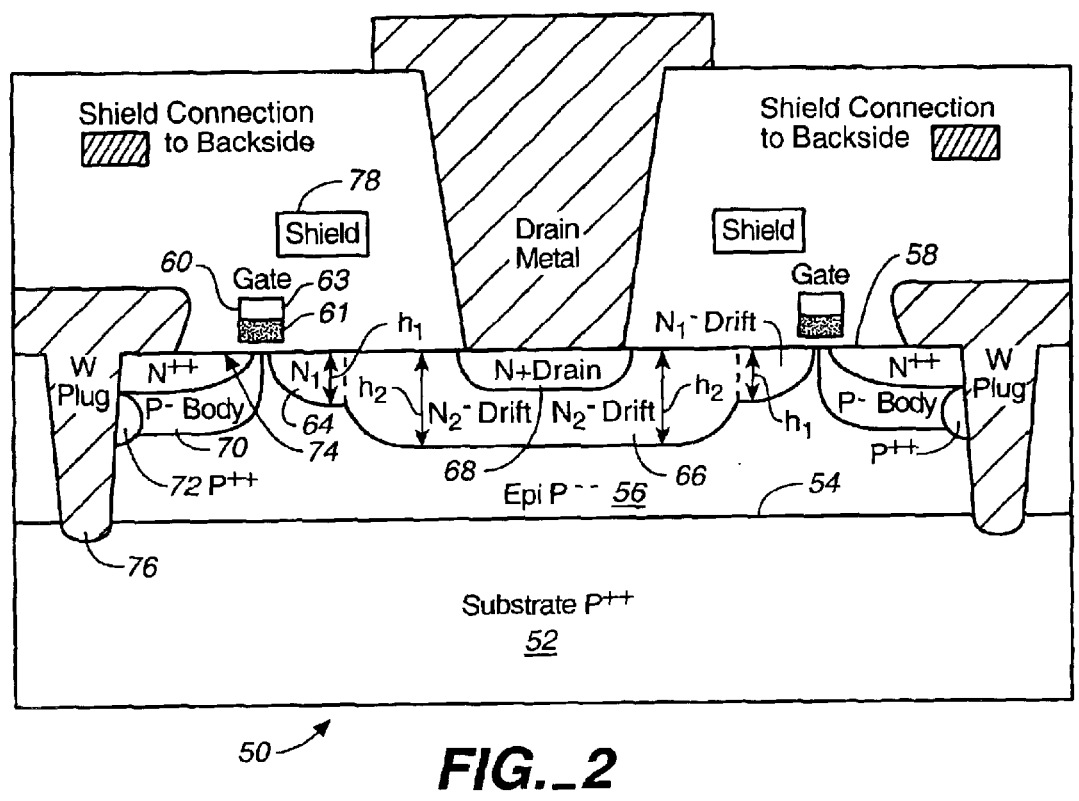
FIG._2
*(PRIOR ART)*

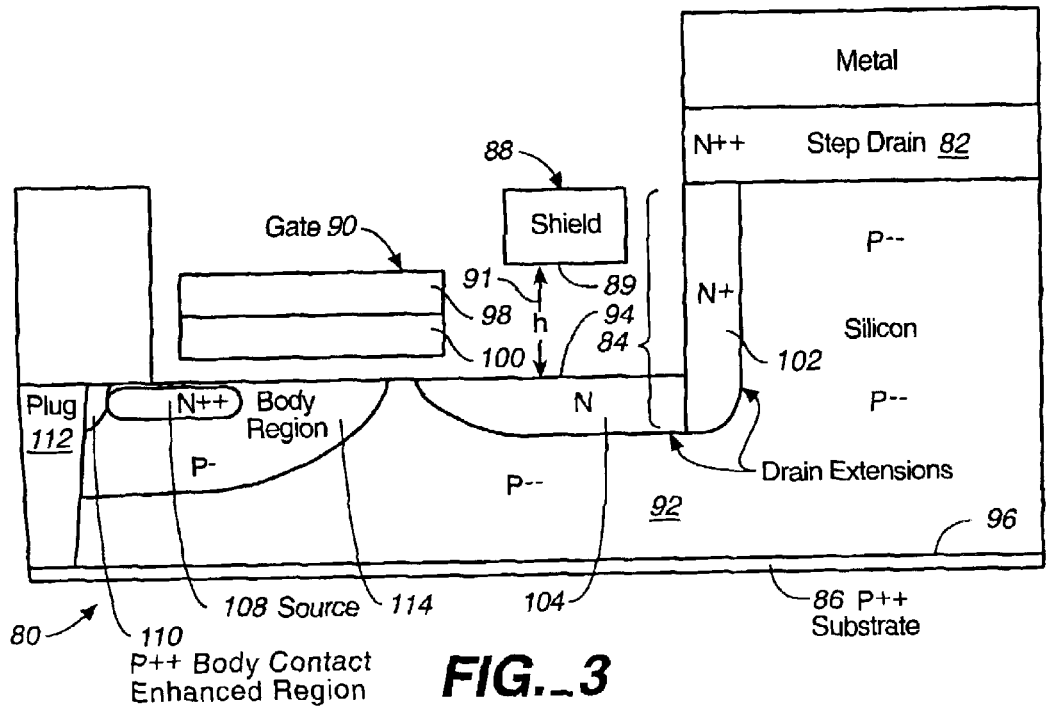
FIG._3
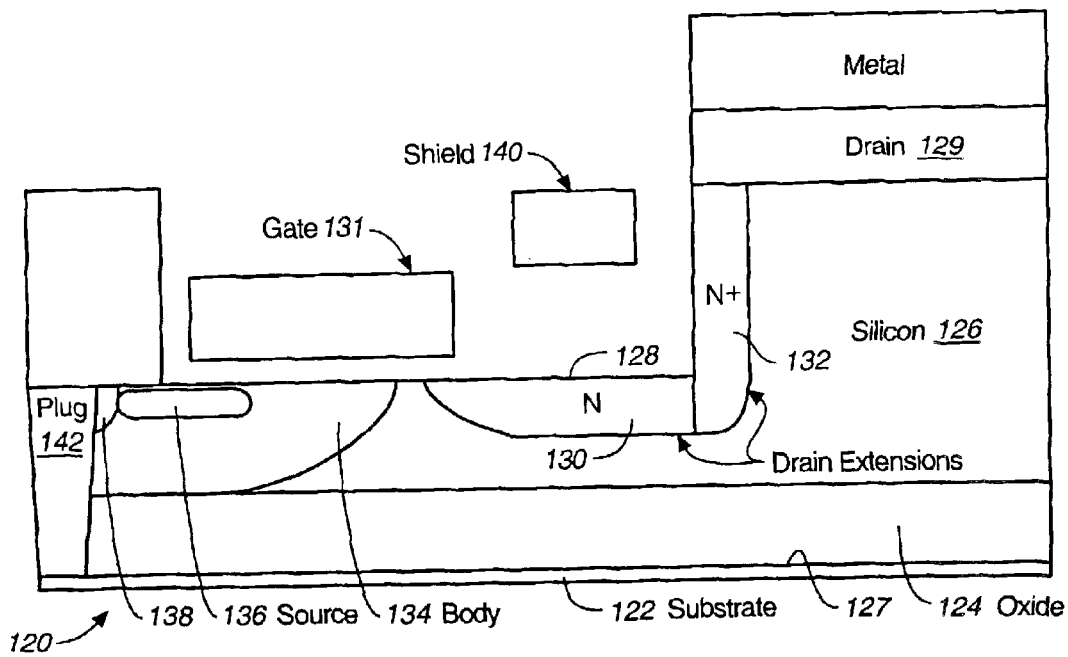
FIG._4

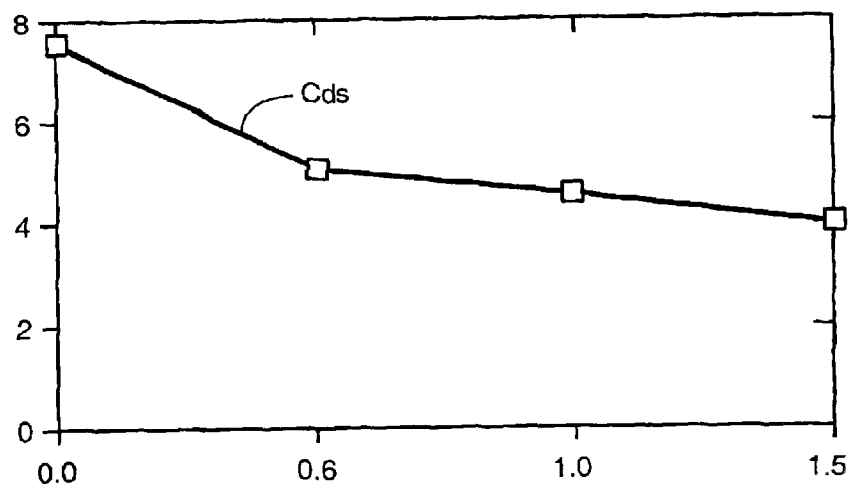
FIG._5
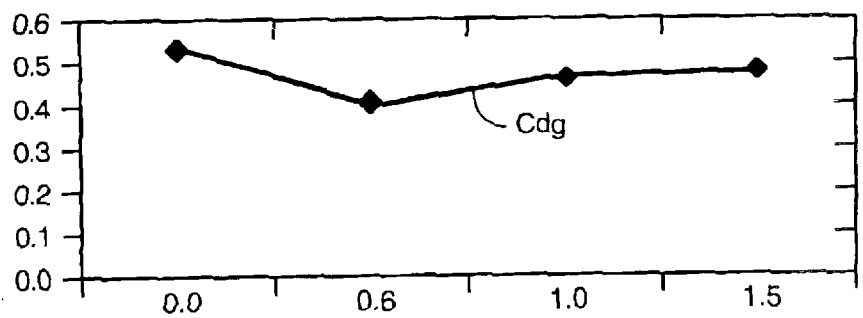
FIG._6
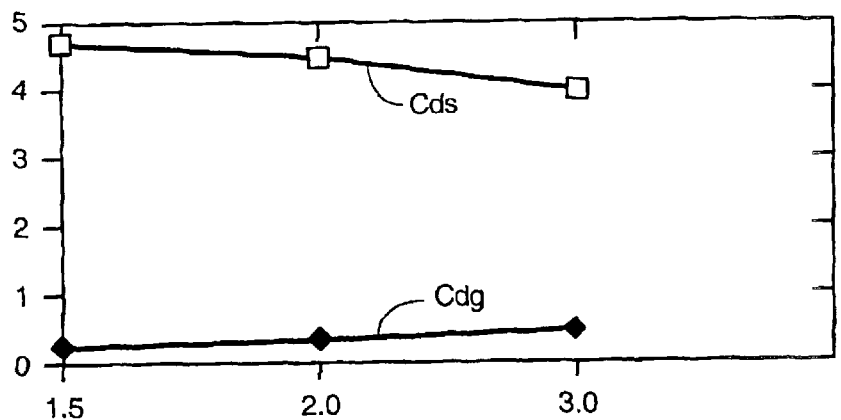
FIG._7

MICROWAVE TRANSISTOR STRUCTURE HAVING STEP DRAIN REGION

BACKGROUND OF THE INVENTION

1. Field of the Invention

The present invention is in the field of microwave field effect transistors, and more specifically, is in the field of a new Silicon power LDMOS structure optimized for operation above 3 GHz, for use in wireless communication applications.

2. Discussion of the Prior Art

The prior art power MOS devices have been widely used lately in wireless communication RF amplifiers for their better linearity, thermal stability and ruggedness as compared to bipolar devices. As the applications for wireless communications move up in the frequency spectrum, parasitic resistances, capacitances and inductances limit the performance of present available structures. More specifically, in the available prior art LDMOS structures that are designed for the highest operational bands of wireless communications the effect of parasitic drain-to-source (Cds) and drain-to-gate (Cdg) capacitances is too big and has to be reduced to achieve the best performance.

Thus, what is needed is a novel MOS structure capable of further reduction of the Cdg and Cds capacitances in devices designed for the highest operational bands of wireless communications.

SUMMARY OF THE INVENTION

To address the shortcomings of the available art, the present invention provides a new microwave transistor structure that is designed specifically to improve the performance of high voltage LDMOS devices used in base station applications.

One aspect of the present invention is directed to a microwave transistor structure having a step drain region. In one embodiment of the present invention, the microwave transistor structure having the step drain region comprises: (a) a substrate having a top surface; (b) a silicon semiconductor material of a first conductivity type including a first dopant concentration; the silicon semiconductor material is overlaying the top surface of the semiconductor substrate and has a top surface; (c) a conductive gate overlying and insulated from the top surface of the silicon semiconductor material; (d) at least one horizontal drain extension region of a second conductivity type including a horizontal drain extension dopant concentration and formed completely within the silicon semiconductor material; (e) a step drain region of the second conductivity type formed in the silicon semiconductor material and contacting the horizontal drain extension region; (f) a body region of the first conductivity type and having a body region dopant concentration formed in the silicon semiconductor material and having a first end underlying the conductive gate region, any remaining portion of the silicon semiconductor material underlying the gate is of the first conductivity type; (g) a source region of the second conductivity type and having a source region dopant concentration formed in the silicon semiconductor material within the body region; (h) a shield plate region being adjacent and being parallel to the drain region formed on the top surface of the silicon semiconductor material over a portion of the horizontal drain extension region; the shield region is adjacent and parallel to the conductive gate region; a bottom of the shield plate extends above the top surface of the silicon semiconductor material, is separated from the top surface of the silicon semiconductor material by a shield plate distance, and is insulated from the top surface of the silicon semiconductor material; and (I) a conductive plug region.

In one embodiment, the microwave transistor structure of the present invention further includes a body contact enhanced region of the first conductivity type, having a body contact enhanced region dopant concentration, and formed in the silicon semiconductor material within the body region. In one embodiment, the body contact enhanced region dopant concentration is greater than the body region dopant concentration.

In one embodiment of the present invention, the first conductivity type is of a P type conductivity type. In another embodiment of the present invention, the first conductivity type is of an N type conductivity type.

In one embodiment of the present invention, the substrate includes a silicon carbide substrate. In another embodiment of the present invention, the substrate includes a silicon substrate.

In one embodiment of the present invention, the conductive gate comprises a metal gate. In another embodiment of the present invention, the conductive gate comprises a highly doped polysilicon gate. In one more embodiment of the present invention, the conductive gate comprises a sandwich gate further comprising a highly doped polysilicon bottom layer and a top layer selected from the group consisting of a tungsten silicided, a titanium silicided, a cobalt silicided, and a platinum silicided.

In one embodiment of the present invention, the step drain structure comprises: the drain region of the second conductivity type formed in the silicon semiconductor material and having a drain dopant concentration; and at least one vertical drain extension region formed in the silicon semiconductor material. In one embodiment of the present invention, the drain region contacts at least one the vertical drain extension region, and at least one vertical drain region contacts the horizontal drain extension region.

In one embodiment of the present invention, the step drain structure comprises: the drain region of the second conductivity type formed in the silicon semiconductor material and having a drain dopant concentration; and a single vertical drain extension region formed in the silicon semiconductor material. In one embodiment of the present invention, the drain region contacts at least one the vertical drain extension region, and the vertical drain region contacts the horizontal drain extension region. In one embodiment, the drain dopant concentration is greater than the vertical drain extension dopant concentration.

In one embodiment of the present invention, the shield plate region is connected to the source region. In another embodiment of the present invention, the shield plate region is connected to a backside of the structure. In one more embodiment of the present invention, the shield plate region is connected to the source region and is connected to the backside of the structure.

In one embodiment of the present invention, the shield plate extends above the top surface of the silicon semiconductor material. In this embodiment of the present invention, the bottom surface of the shield is separated from the top surface of the silicon semiconductor material by the shield plate distance. In one embodiment of the present invention, the shield plate distance is in the range of (4,000 Å–8,000 Å).

In one embodiment of the present invention, the shield plate comprises a metal shield plate. In another embodiment of the present invention, the shield plate comprises a polysilicon shield plate. In one more embodiment of the present invention, the shield plate comprises a silicided shield plate. In an additional embodiment of the present invention, the shield plate comprises a polysilicon/silicided shield plate sandwich. In one more additional embodiment of the present invention, the shield plate comprises a polysilicon/metal shield plate sandwich.

In one embodiment of the present invention, the conductive plug region connects a lateral surface of the body region to the top surface of the substrate. In another embodiment of the present invention, the conductive plug region connects a lateral surface of the body region to a bottom surface of the substrate. In one more embodiment, the conductive plug region is formed in the body contact enhanced region and the body region of the silicon semiconductor material, and connects a top surface or a lateral surface of the body contact enhanced region and connects a lateral surface of the body region to the top surface of the substrate.

In one embodiment of the present invention, the conductive plug comprises a metal plug. In another embodiment of the present invention, the conductive plug is selected from the group consisting of a tungsten plug, a titanium plug, a copper plug, and a gold plug. In one more embodiment of the present invention, the conductive plug comprises a silicided plug. In an additional embodiment of the present invention, the silicided plug is selected from the group consisting of a tungsten silicided plug, a titanium silicided plug, a cobalt silicided plug, and a platinum silicided plug.

In one embodiment of the present invention, the conductive plug comprises a vertical conductive plug region, and a horizontal conductive plug region. In this embodiment, the vertical conductive plug region connects the lateral surface of the body region to the top surface of the substrate, wherein the horizontal conductive plug region connects the vertical conductive plug region to the source region.

In one embodiment of the present invention, the vertical conductive plug is selected from the group consisting of a tungsten vertical plug, a titanium vertical plug, a copper vertical plug, and a vertical gold plug. In one embodiment of the present invention, the vertical plug is selected from the group consisting of a tungsten silicided vertical plug, a titanium silicided vertical plug, a cobalt silicided vertical plug, and a platinum silicided vertical plug.

In one embodiment of the present invention, the horizontal conductive plug is selected from the group consisting of a tungsten horizontal plug, a titanium horizontal plug, a copper horizontal plug, and a horizontal gold plug. In one embodiment of the present invention, the horizontal plug is selected from the group consisting of a tungsten silicided horizontal plug, a titanium silicided horizontal plug, a cobalt silicided horizontal plug, and a platinum silicided horizontal plug.

Another aspect of the present invention is directed to a microwave transistor structure having a step drain region. In one embodiment of the present invention, the microwave transistor structure having the step drain region comprises: (a) a substrate having a top surface; (b) an oxide layer overlaying the top surface of the substrate; (c) a silicon semiconductor material of a first conductivity type having a first dopant concentration and having a top surface; the silicon semiconductor material is overlaying the oxide layer; (d) a conductive gate overlying and insulated from the top surface of the silicon semiconductor material; (e) at least one horizontal drain extension region of a second conductivity type including a horizontal drain extension dopant concentration and formed completely within the silicon semiconductor material; (f) a step drain region of the second conductivity type formed in the silicon semiconductor material and contacting the horizontal drain extension region; (g) a body region of the first conductivity type and having a body region dopant concentration formed in the silicon semiconductor material and having a first end underlying the conductive gate region, any remaining portion of the silicon semiconductor material underlying the gate is of the first conductivity type; (h) a source region of the second conductivity type and having a source region dopant concentration formed in the silicon semiconductor material within the body region; (I) a shield plate region being adjacent and being parallel to the drain region formed on the top surface of the silicon semiconductor material over a portion of the horizontal drain extension region; the shield region is adjacent and parallel to the conductive gate region; a bottom of the shield plate extends above the top surface of the silicon semiconductor material, is separated from the top surface of the silicon semiconductor material by a shield plate distance, and is insulated from the top surface of the silicon semiconductor material; (k) a body contact enhanced region of the first conductivity type, having a body contact enhanced region dopant concentration, and formed in the silicon semiconductor material within the body region; and (l) a conductive plug region.

BRIEF DESCRIPTION OF DRAWINGS

The aforementioned advantages of the present invention as well as additional advantages thereof will be more clearly understood hereinafter as a result of a detailed description of a preferred embodiment of the invention when taken in conjunction with the following drawings.

FIG. 1 depicts the prior art low on resistance FET structure disclosed by Adler et al. in the U.S. Pat. No. 5,252,848, issued to Motorola, Inc.

FIG. 2 illustrates the prior art microwave transistor structure that advances its frequency capabilities by diminishing the gate-to-drain $C_{gd}$ capacitance, without impacting, in a deleterious manner, the other inter-electrode capacitances, including the gate-to-source $C_{gs}$, capacitance.

FIG. 3 depicts the microwave transistor structure of the present invention having a step drain region.

FIG. 4 illustrates the microwave transistor structure of the present invention having a step drain region and having an oxide layer placed between the substrate and the silicon epi layer.

FIG. 5 shows the improvement in Cds as a function of step height while maintaining the total drain extension length constant at 3 microns.

FIG. 6 depicts the improvement in Cdg as a function of step height for the of FIG. 5.

FIG. 7 illustrates Cdg and Cds versus epi thickness for the structure of FIG. 5.

DETAILED DESCRIPTION OF THE PREFERRED AND ALTERNATIVE EMBODIMENTS.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

FIG. 1 depicts the prior art low on resistance FET structure 10 disclosed by Adler et al. in the U.S. Pat. No. 5,252,848, issued to Motorola, Inc. More specifically, a performance enhancing conductor—gate shield 12—is used to make a transistor built on structure 10 low on drain-source resistance. The gate shield 12 is also used reduce the transistor's 10 parasitic gate-to-drain capacitance $C_{gd}$ 14. The gate shield covers the transistor's 10 gate 16 and a portion of the drain region 20 that is adjacent the gate 16. The gate shield 12 is isolated from the gate 16 by an insulator 22. It has been found that gate shield 12 reduces the parasitic gate-to-drain capacitance $C_{gd}$ 14 of transistor 10. According to '848 patent, electric fields emanating from gate 16 capacitively couple gate 16 to drain 18 thus forming a parasitic gate-to-drain capacitance $C_{gd}$ 14. It is believed that gate shield 12 substantially terminates these electric field lines thereby minimizing the gate-to-drain capacitance $C_{gd}$ 14 of transistor 10. To maximize the termination effect of conductor 12, the gate shield 12 of '848 patent covered gate 16 completely. Since gate shield 12 of '848 patent structure minimizes the capacitive coupling between drain 18 and gate 16, drain 18 could be placed as close to source 24 as possible thus reducing the on resistance of transistor 10.

Referring still to FIG. 1, as was stated above in the '848 patent, issued to Motorola, Inc., the classical solution to reducing the parasitic gate-to-drain capacitance $C_{gd}$ is to create a metal shield over the entire gate finger of the device, connected to the source metallization. While this method is effective, it involves the extension of the source metallization over the entire length of the gate finger. Such solution presents two problems. The first problem is as follows: the source metal extension, while lowering the gate-to-drain $C_{gd}$ capacitance, increases the gate-to-source $C_{gs}$ capacitance, as was stated above. In addition, if a device is realized with a single metal process there is a limitation to the coverage of the shield 12 over the gate 16 so as not to contact the drain metal finger 30, as shown in FIG. 1, to avoid shorting drain to source.

Another proposed solution to reduce the Cdg parasitics that affects less the input capacitance was disclosed by the inventors PABLO D'ANNA and JOSEPH H. JOHNSON in the copending U.S. patent application Ser. No. 10/156,605, entitled "MICROWAVE FIELD EFFECT TRANSISTOR STRUCTURE" filed on May 25, 2002. The U.S. Patent "MICROWAVE FIELD EFFECT TRANSISTOR STRUCTURE" is incorporated herein in its entirety and is hereinafter referred to as the Patent application #1.

FIG. 2 depicts the prior art microwave transistor structure 50, as disclosed in the Patent application #1, that advances its frequency capabilities by diminishing the gate-to-drain $C_{gd}$ capacitance, without impacting, in a deleterious manner, the other inter-electrode capacitances, including the gate-to-source $C_{gs}$ capacitance.

More specifically, as disclosed in the Patent application #1, the microwave semiconductor structure 50 of FIG. 2 includes a silicon semiconductor material 56 of a first conductivity type having a first dopant concentration and a top surface 58. The silicon semiconductor material 56 is overlaying the top surface 54 of the semiconductor substrate 52. The silicon semiconductor material 56 is epitaxially grown and comprises an epi layer. A conductive gate 60 overlies the top surface 58 of the epi layer 56. The conductive gate 60 is insulated from the epi layer 56 by a gate silicon dioxide layer (not shown). The gate 60 comprises a polysilicided gate, a highly doped polysilicon gate, or a sandwich gate further comprising a highly doped polysilicon bottom layer 61 and a top layer 63 selected from the group consisting of a tungsten silicided, a titanium silicided, a cobalt silicided, and a platinum silicided. A channel region is formed completely within the epi layer 56. If the epi layer is of the first, P conductivity type, the channel region is of a second, N, conductivity type and includes a channel dopant concentration$^-$. The channel region further includes a first enhanced drain drift region 64 of the second N conductivity type formed completely within the epi layer 56, and having the first enhanced drain drift region dopant concentration $N_1^-$ if the epitaxial layer has P conductivity type. The channel region further includes a second enhanced drain drift region 66 of the second N conductivity type formed completely within the epi layer 56 and having the second enhanced drain drift dopant concentration $N_2^-$ if the epitaxial layer has P conductivity type. The second enhanced drain drift region 66 contacts the first drain drift region 64. The drain region 68 formed in the silicon semiconductor material is of the second conductivity type N if the epi layer has P conductivity type (and vice versa) and includes a drain dopant concentration $N_{drain}^+$. The drain region 68 contacts the channel region.

The prior art structure 50 of the microwave transistor (of FIG. 2) including two drain drift regions (64 and 66) allows one to increase the maximum drain drift current density of the device. The drain-to-source breakdown voltage $V_{breakdown}$ of the structure 50 (of FIG. 2) is also increased. Indeed, the effective electrical field in the channel region is strong enough (about 10 kV/cm) to cause at certain critical concentration of carriers $N_c$ the avalanche effect of carrier multiplication. Thus, the critical carrier concentration $N_c$ is related to the breakdown voltage $V_{breakdown}$, that is defined as the voltage at which the avalanche effect of carrier multiplication takes place. The second drain drift region 66 typically has the concentration $N_2^-$ that is higher than the concentration $N_1^-$ of the first drain drift region 64. This results in the redistribution of the critical electrical fields in the source-drain channel and in an increase of the drain-to-source breakdown voltage $V_{breakdown}$. The maximum current density in the source-drain channel of the prior art device 50 (of FIG. 2) is also increased because the total concentration $N_T = N_1^- + N_2^-$ in both drain enhancement regions reduces the resistance of the drain region 68.

Thus, the prior art structure 50 (of FIG. 2) disclosed in the patent application #1 includes a grounded finger on top of the drain area, and adjacent to the gate finger. This diminishes the parasitic effect on Cgs of the shield extending over the gate finger. The position of this finger over the drain area is critical as it affects drain breakdown and current capability, and again the finger operates effectively only over a limited portion of the extended drain adjacent to the gate.

However, neither the prior art structure 10 (of FIG. 1), nor the prior art structure 50 (of FIG. 2) affects the drain-source Cds capacitance value. At the same time, the high value of the drain-source Cds capacitance is the limiting factor that adversely affects the performance of MOS devices at microwave frequencies.

FIG. 3 depicts the microwave transistor structure 80 of the present invention having a step drain region 82. A stepped up portion 84 of the extended drain area (LDD) provides extra separation between the drain area 82 and the grounded substrate 86. The stepped up portion 84 also allows a reduction of the overall pitch of the device. Both these features reduce the Cds considerably. The advantages of the new structure extend also to a reduction of the Cdg as the finger shield 88 now operates in both portions (near the gate 90 as well as near the drain contact 82) of the extended drain area.

In one embodiment of the present invention, the structure 80 (of FIG. 3) includes a substrate 86 having a top surface 96. In one embodiment, the substrate 86 further includes a silicon carbide (SiC) substrate. The usage of silicon carbide (SiC) substrate 86 significantly improves the thermoconductive properties of a microwave transistor built on structure 80 of FIG. 3, and is disclosed by the inventors PABLO D'ANNA and JOSEPH H. JOHNSON in the U.S. Pat. No. 6,521,923, entitled: "MICROWAVE FIELD EFFECT TRANSISTOR STRUCTURE ON SILICON CARBIDE SUBSTRATE".

In one embodiment of the present invention, the substrate 86 further includes a silicon substrate. In one embodiment of the present invention, the substrate 86 is a highly conductive one and is P-doped with concentration of carriers (0.005–0.01) $\Omega$-cm. In one embodiment, the silicon substrate 86 is heavily Boron doped ($P^{++}$).

Referring still to FIG. 3, the microwave semiconductor structure 80 (of FIG. 3) of the present invention having a step drain region 82 further includes a silicon semiconductor material 92 of a first conductivity type having a first dopant concentration and a top surface 94. The silicon semiconductor material 92 is overlaying the top surface 96 of the semiconductor substrate 86. The silicon semiconductor material 92 is epitaxially grown and comprises an epi layer.

In one embodiment of the present invention, the first conductivity type is of P type, that is the majority carriers are holes. The epi layer's conductivity type is also of a P-type. The dopant concentration of the substrate is $P^{++}$, wherein (++) indicates that the dopant concentration $P^{++}$ of holes in the substrate 86 is large comparatively with the hole concentration $P^{--}$ in the epi layer region 92. The typical thickness of the epitaxial layer 92 is $(3–10)\mu$.

In another embodiment, the epi layer 92 includes a semiconductor material of a second conductivity, – type, having a dopant concentration $N^{--}$. The majority carriers are electrons in this embodiment.

In one embodiment, a thin epi silicon layer 92 on the top surface 96 of the substrate 86 can be grown by using a high temperature chemical vapor deposition (CVD) process. Chemical vapor deposition (CVD) process is the process in which a film is deposited by a chemical reaction or decomposition of a gas mixture at elevated temperature at the wafer surface or in its vicinity. The typical examples of CVD films are a single crystal silicon film, a polycrystalline silicon film, a silicon dioxide film, and a silicon-nitride film. CVD can be performed at atmospheric pressure (APCVD), or at low pressure (LPCVD).

As was mentioned above, epitaxy is a high temperature chemical vapor deposition (CVD) process where a single crystal layer is deposited on a single crystal substrate. Epitaxy is the arrangement of atoms on an ordered substrate which acts as the seed crystal. The atoms produced by the gas reaction impinge on the substrate surface and move around until they find the correct location to bond to the surface atoms, forming a layer of the same crystallographic arrangements as the substrate.

In one of the typical applications of epitaxial deposition, a lightly doped layer is deposited on a heavily doped substrate. The lightly doped layer is the region where active devices are constructed and the heavily doped substrate constitutes a low resistance circuit path.

In another typical application of epitaxial deposition, heavily doped layer is buried in a lightly doped region of opposite polarity. The heavily doped layer is first defined and formed in the substrate using lithography, etching, and doping techniques. For the complete reference, please, see "Fundamentals of Semiconductor Processing Technologies" by Badih El-Kareh, IBM Corporation, published by Kluwer Academic Publishers in 1995.

The epi layer can be intentionally doped while grown by adding controlled amounts of the dopant compounds to the gas stream. Typical dopant sources are hybrids of the impurity, such as phosphine ($PH_3$), arsine ($AsH_3$), antimonine ($SbH_3$), and diborane ($B_2H6$).

In one embodiment, the epi silicon layer 92, about 1–12 microns thick, is grown on the top surface 96 of the substrate 86 in the presence of diborane ($B_2H_6$). This process results in a lightly Boron doped ($P^{--}$) epi silicon layer 92.

A conductive gate 90 overlies the top surface 94 of the epi layer 92. The conductive gate 90 is insulated from the epi layer 92 by a gate silicon dioxide layer (not shown). In one embodiment, a layer of silicon dioxide is grown by oxidizing the silicon surface 94 in a high temperature furnace.

In one embodiment, the gate 90 comprises a polysilicided gate. In another embodiment, the conductive gate 90 further comprises a highly doped polysilicon gate. In one more embodiment, the conductive gate 90 further comprises a sandwich gate further comprising a highly doped polysilicon bottom layer 100 and a top layer 98 selected from the group consisting of a tungsten silicided, a titanium silicided, a cobalt silicided, and a platinum silicided. In one additional embodiment, the conductive gate 90 further comprises a metal gate.

Although silicide generally has a lower resistance than polysilicon, silicide does not readily adhere to gate oxide. Thus, the polysilicon functions as an intermediate layer that bonds to both the silicide and to gate oxide. In the preferred embodiment, gate electrode 90 is approximately 1500 Å of polysilicon that is covered with approximately 2500 Å of tungsten silicide (WSi). The two layer implementation of gate 90 forms a low resistance gate that has a lower profile than is provided by a single layer polysilicon gate of equivalent resistance.

Referring still to FIG. 3, in one embodiment of the present invention, the microwave step drain structure 80 comprises: the drain region 82 of the second conductivity type formed in the silicon semiconductor material and having a drain dopant concentration; and a vertical drain extension region 102 formed in the silicon semiconductor material 92. If the epi layer 92 is of the first, P conductivity type, the drain region is of a second, N, conductivity type and includes a dopant concentration $N^{++}$. If the epi layer 92 is of the first, P conductivity type, the vertical drain extension region 102 is of a second, N, conductivity type and includes a dopant concentration $N^+$. In another embodiment, the drain region 82 and the vertical drain extension region 102 has P conductivity type if the epitaxial layer has N conductivity type. In one embodiment, the typical dimensions of the drain region 82 are $(0.5–3.0)\mu$ horizontally, and $(0.1–0.3)\mu$ vertically. In one embodiment, the vertical drain region 102 has dimensions $(0.1–2.5)\mu$ vertically, and about $(0.2–0.5)\mu$ laterally.

In one embodiment of the present invention, the step drain structure 80 (of FIG. 3) further includes a horizontal drain extension region 104 of the second N conductivity type formed completely within the epi layer 92 and having the horizontal drain extension dopant concentration N if the epitaxial layer has P conductivity type. In another embodiment, the horizontal drain extension region 104 has P conductivity type if the epitaxial layer has N conductivity type. In one embodiment, the horizontal drain region 104 has dimensions $(0.1–2.5)\mu$ laterally, and about $(0.2–0.5)\mu$ vertically.

In one embodiment of the present invention, the drain region 82 contacts the vertical drain extension region 102, and the vertical drain region 102 contacts the horizontal drain extension region 104.

In one embodiment, the drain dopant concentration $N^{++}$ is greater than the vertical drain extension dopant concentration $N^{+}$, and the vertical drain extension dopant concentration $N^{+}$ is greater than horizontal drain extension dopant concentration N.

Referring still to FIG. 3, in one embodiment of the present invention, the shield plate region 88 is connected to the source region 108. In another embodiment of the present invention, the shield plate region 88 is connected to a backside of the structure (not shown). In one more embodiment of the present invention, the shield plate region 88 is connected to the source region 108 and is connected to the backside of the structure.

In one embodiment of the present invention, the shield plate 88 extends above the top surface of the silicon semiconductor material 94. In this embodiment of the present invention, the bottom surface 89 of the shield 88 is separated from the top surface 94 of the silicon semiconductor material 92 by the shield plate distance h 91. In one embodiment of the present invention, the shield plate distance h is in the range of (4,000 Å–8,000 Å).

The shield plate 88 is insulated from the top surface 94 of the epi layer 92. Gate 90 is electrically isolated from the shield plate 88 by an insulator. The preferred embodiment of the insulator is a low temperature thermal oxide that is covered by a layer of silicon nitride (not shown). Silicon nitride provides a highly reliable and substantially defect free insulator that prevents contaminants from affecting the operation of transistor 80. Oxide (not shown) functions as a stress relief that prevents silicon nitride from damaging gate oxide. However, any combination of doped or undoped low temperature deposits on silicon oxide mixtures will also serve for the desired application.

In one embodiment of the present invention, the shield plate 88 comprises a metal shield plate. In another embodiment of the present invention, the shield plate 88 comprises a polysilicon shield plate. In one more embodiment of the present invention, the shield plate 88 comprises a silicided shield plate. In an additional embodiment of the present invention, the shield plate 88 comprises a polysilicon/silicided shield plate sandwich. In one more additional embodiment of the present invention, the shield plate 88 comprises a polysilicon/metal shield plate sandwich.

Referring still to FIG. 3, in one embodiment of the present invention, a body region 114 is also formed in the epi layer 92. The body region 114 includes a first end underlying the conductive gate 90, any remaining portion of the silicon semiconductor material underlying the gate 90 is of the first conductivity type.

The body region 114 has P conductivity type (if the epi layer has P conductivity type and vice versa). The body region has a dopant concentration $P^{-}$ that is equal or greater than the dopant concentration $P^{--}$ of the epi layer 92. The typical dimensions of the body region 114 are $(0.5–1.5)\mu$ horizontally or vertically.

In one embodiment, the body region 114 includes a source region 108 being of N conductivity type (if the epitaxial layer 92 has P conductivity type and vice versa) and having a dopant concentration $N^{++}$. The typical dimensions of the source region 108 are $(0.5–5.0)\mu$ horizontally.

Referring still to FIG. 3, the body region 114 also includes a body contact enhanced region 110. In one embodiment, the body contact enhanced region 110 is of the first conductivity type (if the epitaxial layer has P conductivity type and vice versa) and includes a body contact enhanced region dopant concentration $P^{++}$ that is greater than the body region dopant concentration P. The typical dimensions of the body contact enhanced region 110 are $(0.5–3.0)\mu$ vertically or horizontally.

Referring still to FIG. 3, in one embodiment of the present invention, the conductive plug region 112 connects a lateral surface of the body region 114 to the top surface 96 of the substrate 86. In another embodiment of the present invention, the conductive plug region 112 connects a lateral surface of the body region 114 to a bottom surface of the substrate (not shown). In one more embodiment, the conductive plug region 112 is formed in the body contact enhanced region 110 and the body region 114 of the silicon semiconductor material, and connects a top surface or a lateral surface of the body contact enhanced region 110 and connects a lateral surface of the body region 114 to the top surface 96 of the substrate 86.

In one embodiment of the present invention, the conductive plug 112 comprises a metal plug. In another embodiment of the present invention, the conductive plug 112 is selected from the group consisting of a tungsten plug, a titanium plug, a copper plug, and a gold plug. In one more embodiment of the present invention, the conductive plug 112 comprises a silicided plug. In an additional embodiment of the present invention, the silicided plug 112 is selected from the group consisting of a tungsten silicided plug, a titanium silicided plug, a cobalt silicided plug, and a platinum silicided plug. In one more additional embodiment of the present invention, the conductive plug 112 comprises a titanium, titanium nitride, or tungsten layer in the trench that is filled with gold or copper plug.

In one embodiment of the present invention (not shown), the conductive plug 112 comprises a vertical conductive plug region, and a horizontal conductive plug region. In this embodiment, the vertical conductive plug region connects the lateral surface of the body region to the top surface of the substrate, wherein the horizontal conductive plug region connects the vertical conductive plug region to the source region.

In one embodiment of the present invention (not shown), the vertical conductive plug is selected from the group consisting of a tungsten vertical plug, a titanium vertical plug, a copper vertical plug, and a vertical gold plug. In one embodiment of the present invention (not shown), the vertical plug is selected from the group consisting of a tungsten silicided vertical plug, a titanium silicided vertical plug, a cobalt silicided vertical plug, and a platinum silicided vertical plug.

In one embodiment of the present invention (not shown), the horizontal conductive plug is selected from the group consisting of a tungsten horizontal plug, a titanium horizontal plug, an aluminum horizontal plug, and aluminum-copper alloy horizontal plug, a copper horizontal plug, and a gold horizontal plug. In one embodiment of the present invention (not shown), the horizontal plug is selected from the group consisting of a tungsten silicided horizontal plug, a titanium silicided horizontal plug, a cobalt silicided horizontal plug, and a platinum silicided horizontal plug.

In one prior art structure, disclosed in U.S. Pat. No. 5,155,563 (issued to Motorola), a connection of the source and body regions in the MOS structure to the backside is made through the diffusion of a dopant introduced from the topside of the chip and a metal finger short. However, this diffusion not only moves the topside dopant down and sideways but also moves the substrate dopant up thus reducing the distance between the highly doped substrate interface and the drain area of the device. This diffusion movement of the interface produces an increase of the minimum source-drain capacitance $C_{ds}$ that can be obtained under a high voltage bias $V_{DS}$.

In another prior art structure disclosed in the U.S. Pat. No. 5,841,166 (issued to Spectrian), the connection between the source and body regions in the MOS structure to backside was made by a sinker contact aligned with the source region and spaced from the width of the channel region.

On the other hand, the usage of the conductive plug 112 in the step drain microwave transistor structure 80 (of FIG. 3) of the present invention, takes care of two important prior art technological problems: (1) how to make a good ohmic contact in a small area (2) without long thermal processing cycles. As it is well known in the art, the long thermal processing cycles increase the doping movements thus increasing the source-drain capacitance $C_{ds}$.

Another aspect of the present invention is directed to a microwave transistor structure 120 having a step drain region and having an oxide layer 124 placed between the substrate 122 and silicon epi layer 126, as shown in FIG. 4.

In one embodiment of the present invention, the microwave transistor structure 120 (of FIG. 4) having the step drain region and having the oxide layer 124 comprises: (a) a substrate 122 having a top surface 126; (b) an oxide layer 124 overlaying the top surface 126 of the substrate 122; (c) a silicon semiconductor material 126 of a first conductivity type having a first dopant concentration and having a top surface 128; the silicon semiconductor material is overlaying the oxide layer; (d) a conductive gate 130 overlying and insulated from the top surface 128 of the silicon semiconductor material; (e) at least one horizontal drain extension region 130 of a second conductivity type including a horizontal drain extension dopant concentration and formed completely within the silicon semiconductor material; (f) a step drain region (128, 132) of the second conductivity type formed in the silicon semiconductor material 126 and contacting the horizontal drain extension region 130; (g) a body region 134 of the first conductivity type and having a body region dopant concentration formed in the silicon semiconductor material 126 and having a first end underlying the conductive gate region 130, any remaining portion of the silicon semiconductor material underlying the gate is of the first conductivity type; (h) a source region 136 of the second conductivity type and having a source region dopant concentration formed in the silicon semiconductor material within the body region 134; (I) a shield plate region 140 being adjacent and being parallel to the drain region 128 formed on the top surface of the silicon semiconductor material over a portion of the horizontal drain extension region 130; the shield region 140 is adjacent and parallel to the conductive gate region 130; a bottom of the shield plate extends above the top surface of the silicon semiconductor material, is separated from the top surface of the silicon semiconductor material by a shield plate distance, and is insulated from the top surface of the silicon semiconductor material; (k) a body contact enhanced region 138 of the first conductivity type, having a body contact enhanced region dopant concentration, and formed in the silicon semiconductor material within the body region; and (l) a conductive plug region 142.

All elements of the structure 120 except the oxide layer 124 are fully disclosed above while disclosing the structure 80 of FIG. 3, and are incorporated by reference herein to avoid redundancy.

The step drain structure 80 of FIG. 3 of the present invention (as well as the step drain structure with oxide layer 120 of FIG. 4) has the following advantages as compared with the prior art structure 50 of FIG. 2: (a) reduced Cgs capacitance as the shielding finger does not cover the gate finger and it shields both vertical and horizontal portions of the extended drain area (LDD); (b) reduced Cds capacitance, as the drain distance to the substrate is extended by the height of the stepped area and the device pitch is reduced. A single metal layer solution can be used with a narrower device drain size (necessary for low voltage, high frequency designs).

The performance of the disclosed in the present invention step drain structure 80 (of FIG. 3) was compared by computer simulation with the performance of the prior art structure 50 (of FIG. 2). For the prior art structure 50 (of FIG. 2), an epi thickness was assumed to be of 3 microns, and the dual, asymmetric LDD drain extension, with a total length of 3 microns. The drain extension closest to the gate had a length of 0.75 microns, 0.4 microns deep and 4 E16 peak doping, the drain extension closest to the drain was 0.75 microns deep and had a peak concentration of 9 E17. The optimized results gave a drain source breakdown of 79 volts and a drain saturation current of 12.3 Amps. The simulated device had a gate length of 0.7 microns, and a width of 65 millimeters.

The step drain structure 80 (of FIG. 3) had the same epi thickness, gate length and width and total drain extension length as the referenced horizontal structure.

FIG. 5 shows the improvement in Cds as a function of step height while maintaining the total drain extension length constant at 3 microns. The symmetric dual drain extension in this case, had a uniform depth of 0.4 microns with varying peak concentrations in the horizontal and vertical portions selected to maintain a maximum drain current of no less than 12 Amps and a drain breakdown of better than 80 volts. Changes to the Cdg are shown in FIG. 6 for the same structure. The optimum position and size for the shield finger, was determined for each drain height considered. The optimum position and size for the shield finger was determined to be a thin, tall finger. Thus, this value for the finger size was used subsequently in all simulations. Variations in the capacitances with epi thickness were studied and shown in FIG. 7.

The foregoing description of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A microwave transistor structure having a step drain region comprising:
   a substrate having a top surface;
   a silicon semiconductor material of a first conductivity type, said silicon semiconductor material having a first dopant concentration and a top surface; said silicon semiconductor material overlaying said top surface of said semiconductor substrate;
   a conductive gate overlying and insulated from said top surface of said silicon semiconductor material;
   at least one horizontal drain extension region formed completely within said silicon semiconductor material, said horizontal drain extension region being of a second conductivity type and having a horizontal drain extension dopant concentration;
   a step drain region formed in said silicon semiconductor material; said step drain region contacting said horizontal drain extension region; a body region formed in said silicon semiconductor material, said body region being of said first conductivity type and having a body region dopant concentration, said body region dopant concentration being equal or greater than said first dopant concentration, said body region having a first end underlying said conductive gate, any remaining portion of said silicon semiconductor material underlying said gate being of said first conductivity type;
   a source region formed in said silicon semiconductor material, said source region being of said second conductivity type and having a source region dopant concentration, said source region being located within said body region;
   a shield plate region formed on said top surface of said silicon semiconductor material over a portion of said horizontal drain extension region, said shield plate being adjacent and parallel to said horizontal drain extension region; said shield plate being adjacent and parallel to said conductive gate region; a bottom of said shield plate extending above said top surface of said silicon semiconductor material, said bottom surface of said shield separated from said top surface of said silicon semiconductor material by a shield plate distance, said shield plate being insulated from said top surface of said silicon semiconductor material; and
   a conductive plug region.

2. The microwave transistor structure of claim 1; wherein said conductive plug region connects a lateral surface of said body region to said top surface of said substrate.

3. The microwave transistor structure of claim 1; wherein said conductive plug region connects a lateral surface of said body region to a bottom surface of said substrate.

4. The microwave transistor structure of claim 1 further including:
   a body contact enhanced region formed in said silicon semiconductor material, said body contact enhanced region being of said first conductivity type and having a body contact enhanced region dopant concentration, said body contact enhanced region dopant concentration being greater than said body region dopant concentration, said body contact enhanced region being located within said body region.

5. The microwave transistor structure of claim 4, wherein said conductive plug region further includes:
   a conductive plug region formed in said body contact enhanced region and said body region of said silicon semiconductor material, wherein said conductive plug region connects a top surface or a lateral surface of said body contact enhanced region and connects a lateral surface of said body region to said top surface of said substrate.

6. The microwave transistor structure of claim 1, wherein said substrate further includes:
   a silicon carbide substrate.

7. The microwave transistor structure of claim 1, wherein said substrate further includes:
   a silicon substrate.

8. The microwave transistor structure of claim 1, wherein said shield plate region further includes:
   a shield plate region being connected to said source region.

9. The microwave transistor structure of claim 1, wherein said shield plate region further includes:
   a shield plate region being connected to a backside of said structure.

10. The microwave transistor structure of claim 1, wherein said shield plate region further includes:
    a shield plate region being connected to said source region and being connected to said backside of said structure.

11. The microwave transistor structure of claim 1, wherein said first conductivity type further comprises:
    a P type conductivity type.

12. The microwave transistor structure of claim 1, wherein said first conductivity type further comprises:
    an N type conductivity type.

13. The microwave transistor structure of claim 1, wherein said conductive plug further comprises:
    a metal plug.

14. The microwave transistor structure of claim 13, wherein said conductive plug is selected from the group consisting of a tungsten plug, a titanium plug, a copper plug, and a gold plug.

15. The microwave transistor structure of claim 1, wherein said conductive plug further comprises:
    a silicided plug.

16. The microwave transistor structure of claim 15, wherein said silicided plug is selected from the group consisting of a tungsten silicided plug, a titanium silicided plug, a cobalt silicided plug, and a platinum silicided plug.

17. The microwave transistor structure of claim 1, wherein said conductive plug further comprises:
    a vertical conductive plug region; and
    a horizontal conductive plug region;
    wherein said vertical conductive plug region connects said lateral surface of said body region to said top surface of said substrate; and wherein said horizontal conductive plug region connects said vertical conductive plug region to said source region.

18. The microwave transistor structure of claim 17, wherein said vertical conductive plug is selected from the group consisting of a tungsten vertical plug, a titanium vertical plug, a copper vertical plug, and a vertical gold plug.

19. The microwave transistor structure of claim 17, wherein said vertical plug is selected from the group consisting of a tungsten silicided vertical plug, a titanium silicided vertical plug, a cobalt silicided vertical plug, and a platinum silicided vertical plug.

20. The microwave transistor structure of claim 17, wherein said horizontal conductive plug is selected from the group consisting of a tungsten horizontal plug, a titanium horizontal plug, an aluminum horizontal plug, an aluminum-copper alloy horizontal plug, a copper horizontal plug, and a horizontal gold plug.

21. The microwave transistor structure of claim 17, wherein said horizontal plug is selected from the group consisting of a tungsten silicided horizontal plug, a titanium silicided horizontal plug, a cobalt silicided horizontal plug, and a platinum silicided horizontal plug.

22. The microwave transistor structure of claim 1, wherein said conductive gate further comprises:
   a highly doped polysilicon gate.

23. The microwave transistor structure of claim 1, wherein said conductive gate further comprises:
   a sandwich gate further comprising a highly doped polysilicon bottom layer and a top layer selected from the group consisting of a tungsten silicided, a titanium silicided, a cobalt silicided, and a platinum silicided.

24. The microwave transistor structure of claim 1, wherein said conductive gate further comprises:
   a metal gate.

25. The microwave transistor structure of claim 1, wherein said shield plate further comprises:
   a metal shield plate.

26. The microwave transistor structure of claim 1, wherein said shield plate further comprises:
   a polysilicon shield plate.

27. The microwave transistor structure of claim 1, wherein said shield plate further comprises:
   a silicided shield plate.

28. The microwave transistor structure of claim 1, wherein said shield plate further comprises:
   a polysilicon/silicided shield plate sandwich.

29. The microwave transistor structure of claim 1, wherein said shield plate further comprises:
   a polysilicon/metal shield plate sandwich.

30. The microwave transistor structure of claim 1, wherein said shield plate further comprises:
   a shield plate extending above said top surface of said silicon semiconductor material, said bottom surface of said shield separated from said top surface of said silicon semiconductor material by said shield plate distance, wherein said shield plate distance is in the range of (4,000 Å–8,000 Å).

31. The microwave transistor structure of claim 1, wherein said step drain structure further comprises:
   at least one vertical drain extension region formed in said silicon semiconductor material, at least one said vertical drain region contacting said horizontal drain extension region; and
   a drain region formed in said silicon semiconductor material, said drain region being of said second conductivity type and having a drain dopant concentration; said drain region contacting at least one said vertical drain extension region.

32. The microwave transistor structure of claim 1, wherein said step drain structure further comprises:
   a vertical drain extension region formed in said silicon semiconductor material, said vertical drain region being of said second conductivity type and having a vertical drain dopant concentration greater than said horizontal drain extension dopant concentration; said vertical drain region contacting said horizontal drain extension region; and
   a drain region formed in said silicon semiconductor material, said drain region being of said second conductivity type and having a drain dopant concentration greater than said vertical drain extension dopant concentration; said drain region contacting said vertical drain extension region.

33. A microwave transistor structure having a step drain region comprising:
   a substrate having a top surface;
   an oxide layer, said oxide layer overlaying said top surface of said substrate;
   a silicon semiconductor material of a first conductivity type, said silicon semiconductor material having a first dopant concentration and a top surface; said silicon semiconductor material overlaying said oxide layer;
   a conductive gate overlying and insulated from said top surface of said silicon semiconductor material;
   at least one horizontal drain extension region formed completely within said silicon semiconductor material, said horizontal drain extension region being of a second conductivity type and having a horizontal drain extension dopant concentration;
   a step drain region formed in said silicon semiconductor material; said step drain region contacting said horizontal drain extension region; a body region formed in said silicon semiconductor material, said body region being of said first conductivity type and having a body region dopant concentration, said body region dopant concentration being equal or greater than said first dopant concentration, said body region having a first end underlying said conductive gate, any remaining portion of said silicon semiconductor material underlying said gate being of said first conductivity type;
   a source region formed in said silicon semiconductor material, said source region being of said second conductivity type and having a source region dopant concentration, said source region being located within said body region;
   a shield plate region formed on said top surface of said silicon semiconductor material over a portion of said horizontal drain extension region, said shield plate being adjacent and parallel to said horizontal drain extension region; said shield plate being adjacent and parallel to said conductive gate region; a bottom of said shield plate extending above said top surface of said silicon semiconductor material, said bottom surface of said shield separated from said top surface of said silicon semiconductor material by a shield plate distance, said shield plate being insulated from said top surface of said silicon semiconductor material; and
   a conductive plug region.

34. The microwave transistor structure of claim 33; wherein said conductive plug region connects a lateral surface of said body region to a bottom surface of said oxide layer; and wherein said conductive plug region connects a lateral surface of said body region to said top surface of said substrate.

35. The microwave transistor structure of claim 33; wherein said conductive plug region connects a lateral surface of said body region to a bottom surface of said substrate.

36. The microwave transistor structure of claim 33 further including:
   a body contact enhanced region formed in said silicon semiconductor material, said body contact enhanced region being of said first conductivity type and having a body contact enhanced region dopant concentration, said body contact enhanced region dopant concentration being greater than said body region dopant concentration, said body contact enhanced region being located within said body region.

37. The microwave transistor structure of claim 33, wherein said conductive plug region further includes:
a conductive plug region formed in said body contact enhanced region and said body region of said silicon semiconductor material, wherein said conductive plug region connects a top surface or a lateral surface of said body contact enhanced region and connects a lateral surface of said body region to said top surface of said substrate; and wherein said conductive plug region connects said top surface or said lateral surface of said body contact enhanced region and connects said lateral surface of said body region to said bottom surface of said oxide layer.

38. The microwave transistor structure of claim 33, wherein said substrate further includes:
a silicon carbide substrate.

39. The microwave transistor structure of claim 33, wherein said substrate further includes:
a silicon substrate.

40. The microwave transistor structure of claim 33, wherein said shield plate region further includes:
a shield plate region being connected to said source region.

41. The microwave transistor structure of claim 33, wherein said shield plate region further includes:
a shield plate region being connected to a backside of said structure.

42. The microwave transistor structure of claim 33, wherein said shield plate region further includes:
a shield plate region being connected to said source region and being connected to said backside of said structure.

43. The microwave transistor structure of claim 33, wherein said first conductivity type further comprises:
a P type conductivity type.

44. The microwave transistor structure of claim 33, wherein said first conductivity type further comprises:
an N type conductivity type.

45. The microwave transistor structure of claim 33, wherein said conductive plug further comprises:
a metal plug.

46. The microwave transistor structure of claim 33, wherein said conductive plug is selected from the group consisting of a tungsten plug, a titanium plug, a copper plug, and a gold plug.

47. The microwave transistor structure of claim 33, wherein said conductive plug further comprises:
a silicided plug.

48. The microwave transistor structure of claim 47, wherein said silicided plug is selected from the group consisting of a tungsten silicided plug, a titanium silicided plug, a cobalt silicided plug, and a platinum silicided plug.

49. The microwave transistor structure of claim 33, wherein said conductive plug further comprises:
a vertical conductive plug region; and
a horizontal conductive plug region;
wherein said vertical conductive plug region connects said lateral surface of said body region to said top surface of said substrate; and wherein said vertical conductive plug region connects said lateral surface of said body region to said bottom surface of said oxide layer; and wherein said horizontal conductive plug region connects said vertical conductive plug region to said source region.

50. The microwave transistor structure of claim 49, wherein said vertical conductive plug is selected from the group consisting of a tungsten vertical plug, a titanium vertical plug, a copper vertical plug, and a vertical gold plug.

51. The microwave transistor structure of claim 49, wherein said vertical plug is selected from the group consisting of a tungsten silicided vertical plug, a titanium silicided vertical plug, a cobalt silicided vertical plug, and a platinum silicided vertical plug.

52. The microwave transistor structure of claim 49, wherein said horizontal conductive plug is selected from the group consisting of a tungsten horizontal plug, a titanium horizontal plug, a copper horizontal plug, and a horizontal gold plug.

53. The microwave transistor structure of claim 49, wherein said horizontal plug is selected from the group consisting of a tungsten silicided horizontal plug, a titanium silicided horizontal plug, a cobalt silicided horizontal plug, and a platinum silicided horizontal plug.

54. The microwave transistor structure of claim 33, wherein said conductive gate further comprises:
a highly doped polysilicon gate.

55. The microwave transistor structure of claim 33, wherein said conductive gate further comprises:
a sandwich gate further comprising a highly doped polysilicon bottom layer and a top layer selected from the group consisting of a tungsten silicided, a titanium silicided, a cobalt silicided, and a platinum silicided.

56. The microwave transistor structure of claim 33, wherein said conductive gate further comprises:
a metal gate.

57. The microwave transistor structure of claim 33, wherein said shield plate further comprises:
a metal shield plate.

58. The microwave transistor structure of claim 33, wherein said shield plate further comprises:
a polysilicon shield plate.

59. The microwave transistor structure of claim 33, wherein said shield plate further comprises:
a silicided shield plate.

60. The microwave transistor structure of claim 33, wherein said shield plate further comprises:
a polysilicon/silicided shield plate sandwich.

61. The microwave transistor structure of claim 33, wherein said shield plate further comprises:
a polysilicon/metal shield plate sandwich.

62. The microwave transistor structure of claim 33, wherein said shield plate further comprises:
a shield plate extending above said top surface of said silicon semiconductor material, said bottom surface of said shield separated from said top surface of said silicon semiconductor material by said shield plate distance, wherein said shield plate distance is in the range of (4,000 Å–8,000 Å).

63. The microwave transistor structure of claim 33, wherein said step drain structure further comprises:
at least one vertical drain extension region formed in said silicon semiconductor material, at least one said vertical drain region contacting said horizontal drain extension region; and a drain region formed in said silicon semiconductor material, said drain region being of said second conductivity type and having a drain dopant concentration; said drain region contacting at least one said vertical drain extension region.

64. The microwave transistor structure of claim 33, wherein said step drain structure further comprises:

a vertical drain extension region formed in said silicon semiconductor material, said vertical drain region being of said second conductivity type and having a vertical drain dopant concentration greater than said horizontal drain extension dopant concentration; said vertical drain region contacting said horizontal drain extension region; and a drain region formed in said silicon semiconductor material, said drain region being of said second conductivity type and having a drain dopant concentration greater than said vertical drain extension dopant concentration; said drain region contacting said vertical drain extension region.

* * * * *